United States Patent
Bedair

(10) Patent No.: US 12,396,295 B2
(45) Date of Patent: Aug. 19, 2025

(54) INDIUM GALLIUM NITRIDE (InGaN) RELAXED TEMPLATES EMPLOYED AS A SUBSTRATE FOR NITRIDE-BASED DEVICES AND RELATED METHODS

(71) Applicant: North Carolina State University, Raleigh, NC (US)

(72) Inventor: Salah M. Bedair, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 588 days.

(21) Appl. No.: 17/724,755

(22) Filed: Apr. 20, 2022

(65) Prior Publication Data

US 2022/0336699 A1    Oct. 20, 2022

Related U.S. Application Data

(60) Provisional application No. 63/177,026, filed on Apr. 20, 2021.

(51) Int. Cl.
*H01L 29/06* (2006.01)
*H01L 31/00* (2006.01)
(Continued)

(52) U.S. Cl.
CPC .... *H10H 20/815* (2025.01); *H10H 20/01335* (2025.01); *H10H 20/812* (2025.01); *H10H 20/8162* (2025.01); *H10H 20/825* (2025.01)

(58) Field of Classification Search
CPC ..... H01L 33/007; H01L 33/06; H01L 33/145; H01L 33/32; H01L 33/12; H01L 33/0075; H01L 21/02458; H01L 21/0254; H01L 21/02389; H01L 33/0045; H01L 33/0066; H01L 33/08; H01L 33/22; H01L 29/2003; H01L 31/1848; H01L 33/0016; H01L 33/0025

See application file for complete search history.

(56) References Cited

U.S. PATENT DOCUMENTS 5,202,895 A * 4/1993 Nitta ................... H01S 5/34326
372/45.01

OTHER PUBLICATIONS

Routh, et al., "Device quality templates of InxGa1-xN (X<0.1) with defect desities comparable to GaN", Appl. Phys Lett. 117, Aug. 2020 (Year: 2020).*

(Continued)

*Primary Examiner* — Niki H Nguyen
(74) *Attorney, Agent, or Firm* — Thomas | Horstemeyer, LLP

(57) ABSTRACT

Various examples are provided related to InGaN-relaxed templates. In one example, a device structure includes a GaN layer; and a semibulk template comprising a plurality of stacked periods on the GaN layer. Each period can include a layer of InGaN and a GaN interlayer disposed on the layer of InGaN, where a thickness of the GaN interlayer of a top period of the stacked periods is greater than a thickness of the GaN interlayer of a bottom period disposed on the GaN layer. In another example, a method includes forming a GaN layer and forming a semibulk template including a plurality of stacked periods on the GaN layer. Each period can include a layer of InGaN and a GaN interlayer disposed on the layer of InGaN, where a thickness of the GaN interlayer of the top period is greater than the GaN interlayer of the bottom period.

22 Claims, 11 Drawing Sheets

(51) Int. Cl.
*H10H 20/01* (2025.01)
*H10H 20/812* (2025.01)
*H10H 20/815* (2025.01)
*H10H 20/816* (2025.01)
*H10H 20/825* (2025.01)

(56) References Cited

OTHER PUBLICATIONS

Routh, et al., "Device quality templates of InxGa1-xN (X<0.1) with defect desities comparable to GaN", Appl. Phys Lett. 117, Aug. 2020.

* cited by examiner

A: Conventional SB

B: SB with increasing interlayer thickness

TABLE I. Dislocation density obtained from (00.2) and (10.5) rocking curves for (sample B).

|  | (00.2)/tilt/screw | (10.5)/twist/edge |
|---|---|---|
| Peak pos. relative to GaN, $\Delta\omega$ | −680 arc sec | −2529 arc sec |
| Integral breadth, $\beta$ | 332 arc sec | 799 arc sec |
| Rotational angle, $\alpha_0$ | 315 arc sec | 247 arc sec |
| Dislocation density, $D_{screw/edge}$ | $1.3 \times 10^8$ cm$^{-2}$ | $5.3 \times 10^8$ cm$^{-2}$ |

$(2\ \mu m)^2$ scan area
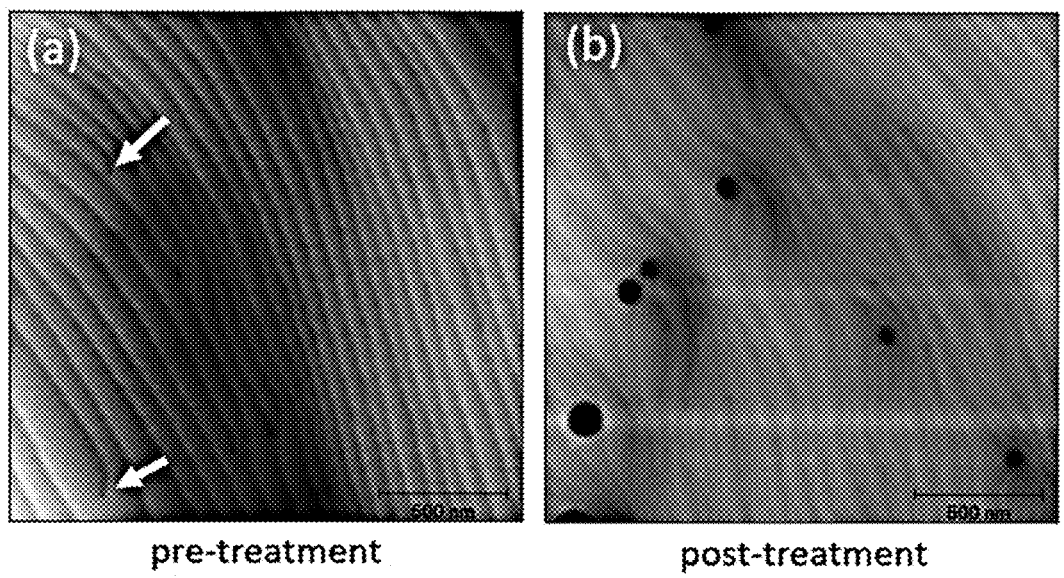
pre-treatment  post-treatment
FIG. 6A  FIG. 6B
$(5\ \mu m)^2$ scan area
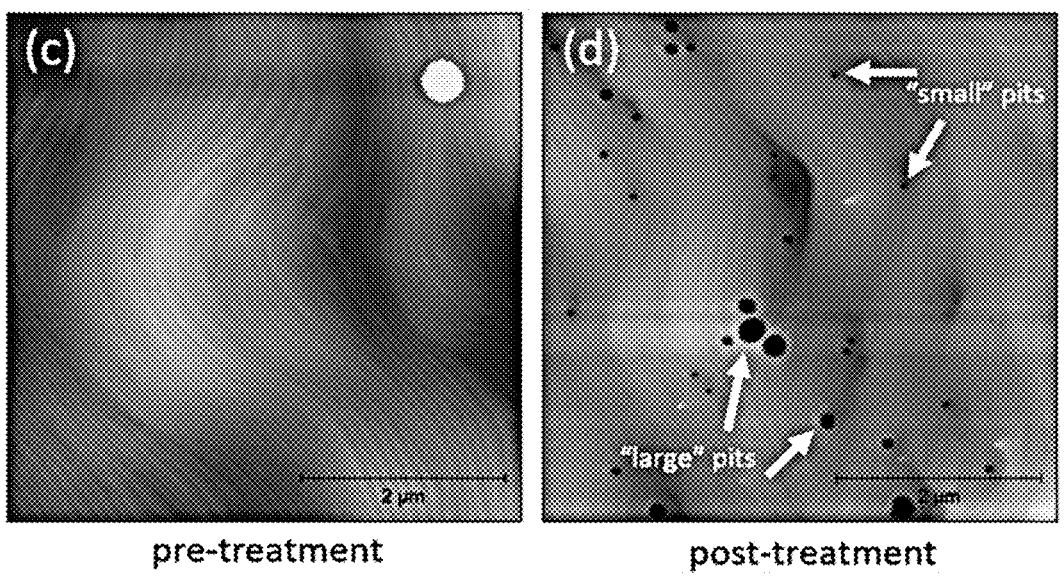
pre-treatment  post-treatment
FIG. 6C  FIG. 6D

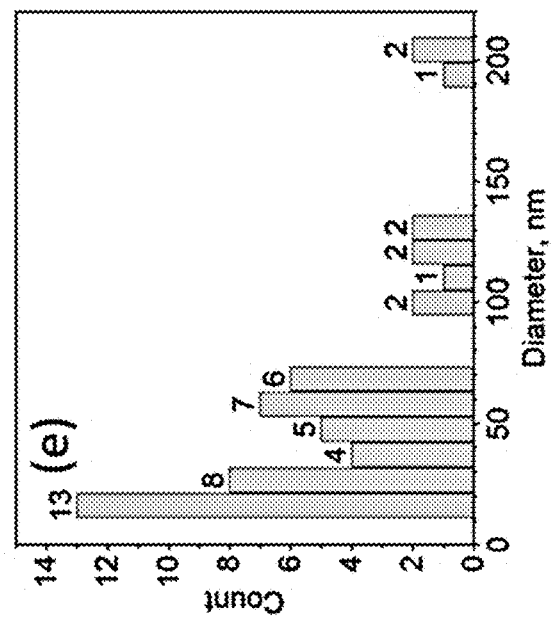

FIG. 6E

TABLE II. Etch pit density determined via AFM and silane etching for sample C.

| | | $(2\ \mu m)^2$ scan area | | $(5\ \mu m)^2$ scan area | | Weighted average |
| --- | --- | --- | --- | --- | --- | --- |
| | | Pre-treatment | Post-treatment | Pre-treatment | Post-treatment | |
| Small pits | Count | 5 | 6 | 18 | 43 | ... |
| | Pit density | $1.3 \times 10^8\ cm^{-2}$ | $1.5 \times 10^8\ cm^{-2}$ | $7.2 \times 10^7\ cm^{-2}$ | $1.8 \times 10^8\ cm^{-2}$ | $1.8 \times 10^8\ cm^{-2}$ |
| Large pits | Count | ... | 5 | ... | 10 | ... |
| | Pit density | ... | $1.3 \times 10^8\ cm^{-2}$ | ... | $4.0 \times 10^7\ cm^{-2}$ | $5.2 \times 10^7\ cm^{-2}$ |
| Total pits | Count | 5 | 11 | 18 | 53 | ... |
| | Pit density | $1.3 \times 10^8\ cm^{-2}$ | $2.8 \times 10^8\ cm^{-2}$ | $7.2 \times 10^7\ cm^{-2}$ | $2.2 \times 10^8\ cm^{-2}$ | $2.3 \times 10^8\ cm^{-2}$ |

FIG. 7

INDIUM GALLIUM NITRIDE (InGaN) RELAXED TEMPLATES EMPLOYED AS A SUBSTRATE FOR NITRIDE-BASED DEVICES AND RELATED METHODS

CROSS REFERENCE TO RELATED APPLICATIONS

This application claims priority to, and the benefit of, U.S. provisional application entitled "Indium-Gallium Nitride (InGaN) Relaxed Templates Employed as a Substrate for Nitride-Based Devices and Related Methods" having Ser. No. 63/177,026, filed Apr. 20, 2021, which is hereby incorporated by reference in its entirety.

STATEMENT REGARDING FEDERALLY SPONSORED RESEARCH OR DEVELOPMENT

This invention was made with government support under grant numbers ECCS1407772 and ECCS1665211 awarded by the National Science Foundation. The government has certain rights in the invention.

BACKGROUND

GaN based optoelectronic devices have witness unprecedent developments that touch our daily life. However, there are obstacles hindering further improvements in LED performances such as "Droop" and the "Green Gap". Droop was observed in the field of Solid-State Lighting (SSL) where the external quantum Efficiency of LEDs Drops at high current density. Recently, Auger recombination's or carrier leakage are the main reasons for Droop in the blue LEDs used in SSL. To achieve red LED is a problem due to "Green Gap" where high values Indium in the QW are needed and the strain when grown on GaN substrates becomes especially prevalent.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 6A-6E illustrate examples of atomic force microscopy (AFM) image height retrace of sample C before and after silane treatments, in accordance with various embodiments of the present disclosure.

FIG. 7 is a table illustrating an example of silane treatment results, in accordance with various embodiments of the present disclosure.

DETAILED DESCRIPTION

Figure 1A:
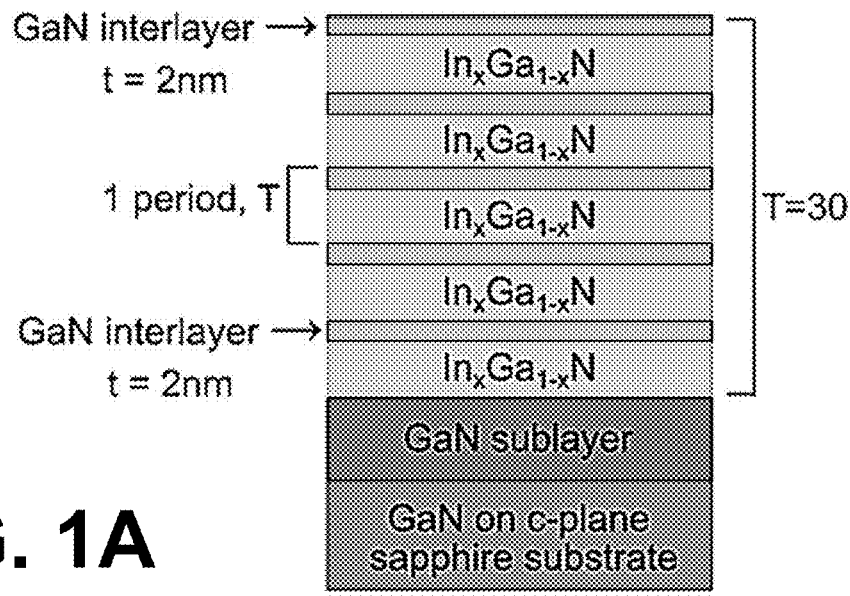
FIGS. 1A and 1B schematically illustrate examples of $In_xGa_{1-x}N$/GaN semibulk (SB) microstructures with conventional and increasing GaN interlayer thicknesses, in accordance with various embodiments of the present disclosure.

Disclosed herein are various examples related to InGaN-relaxed templates, which can be used as substrates to nitride-based devices. The growth of InGaN-relaxed templates on GaN as substrates can reduce the strain in the MQW structures. Relaxation in the InGaN templates, grown on a GaN prelayer, due to the lattice mismatch, can be accommodated by the generation of V-pits rather than the formation of misfit dislocations. $In_xGa_{1-x}N$ templates (x~0.1) can be grown via a modified semibulk (SB) approach, with a gradually increasing GaN interlayer thickness to provide a mechanism for backfilling of V-pits. High-resolution x-ray diffraction rocking curves can be used to quantify the edge-type and screw-type dislocation density present in the SB and the results can be with the etch pit density obtained via atomic force microscopy after treating the SB with a silane etch. Device-quality InGaN templates with defect density in the mid $10^8$ $cm^{-2}$ were investigated using the above two approaches, with a quality comparable to state-of-the-art GaN. Reference will now be made in detail to the description of the embodiments as illustrated in the drawings, wherein like reference numbers indicate like parts throughout the several views.

InGaN/GaN multiple quantum well (MQW) structures currently used in optical devices are based on highly strained InGaN films. Traditionally, InGaN/GaN multiple quantum wells (MQWs) are grown on a sapphire wafer with a GaN prelayer. However, the large lattice mismatch between InN and GaN (up to 11%) can prove to be challenging for device performance as the large lattice mismatch produces a compressive strain in the QWs, diminishing the performance of the device. The strain becomes especially prevalent in increasing values of x where emission ranges from green to red. This has colloquially been deemed the "green gap problem." The presence of strain reduces quantum efficiency and indium incorporation, two critical parameters in addressing the green gap.

Ideally, InGaN-based structures are to be grown on InGaN templates, which are nearly lattice matched to avoid the harmful effect of strain. However, such templates grown as bulk InGaN on GaN face several problems, such as rough surfaces, high densities of V-pits, high density of threading dislocations ($10^9$-$10^{10}$ $cm^{-2}$ range), metal inclusions, and stacking faults. In addition, earlier effort on InGaN templates was limited to very low values of x in $In_xGa_{1-x}N$, strained films, or highly defective templates.

Threading dislocations (TDs) arise from the interface of InGaN templates grown on GaN due to the lattice mismatch, which propagate into the device region. These defects are present in the form of edge-, screw-, and mixed-type dislocations. Also, V-pits have been shown to form at the termination of TDs at a free surface in InGaN to release some of the strain present in the films. V-pits, with the density in the $10^9$ cm$^{-2}$ range, present as six-sided hexagonal shaped pits oriented toward the (0001) surface with faces on the {10-11} planes. It has been shown via transmission electron microscopy (TEM) studies that, for $In_xGa_{1-x}N$ (x<0.1) templates grown on GaN, relaxation due to the lattice mismatch can be accommodated by the formation of V-pits rather than the formation of new misfit dislocations. However, these high densities of V-pits and dislocations will impact the device performances based on MQW structures grown on these templates.

To circumvent the lattice mismatch problem in InGaN grown on GaN, a semibulk (SB) template approach can be used. The usage of SB in, e.g., LEDs is discussed elsewhere in this disclosure. The SB contains 20-30 periods of low temperature InGaN with 1-2 nm thick GaN interlayers grown on commercially supplied GaN substrates. These V-pits can be refilled by the GaN interlayers during the SB growth processes, thus rendering a smooth top surface. However, for thick templates grown by the SB, it was observed that for a high degree of relaxation, the V-pits get larger in size on the surface and become very deep, and the GaN interlayer filling process is not efficient, resulting in rough surfaces. The degree of relaxation as well as the size of the V-pits increases with the film thickness during the SB growth and relaxation processes.

As presented in the current disclosure, the SB growth can be modified by gradually increasing the GaN interlayer thickness to increase the chances of filling these V-pits specifically for the topmost layers of the InGaN templates where higher degrees of relaxation are taking place. By increasing the GaN interlayer thickness as the SB growth proceeds, the SB film is able to relax via V-pit formation without sacrificing the surface morphology, as the GaN interlayer provides a mechanism of back filling. Such an approach will result in templates with both smooth surfaces and low dislocation densities (mid $10^8$ cm$^{-2}$) since the relaxation due to the lattice mismatch between the InGaN and GaN substrates is accommodated by the V-pit formation rather than new misfit dislocations. The ability to decrease the number of existing V-pits by increasing the thickness of the GaN interlayer in pseudomorphic InGaN/GaN superlattices grown on InGaN pseudo-substrates has been shown. The current approach is compatible with Metal-Organic Chemical Vapor Deposition (MOCVD) growth of large area InGaN templates that will be the substrates for MQW device structures.

Semibulk (SB) samples were grown on 300 μm n-type GaN on sapphire substrates supplied commercially (dislocation density ~$10^8$ cm$^{-2}$) via MOCVD. An example of a conventional SB, shown in FIG. 1A, is made of 18 nm $In_xGa_{1-x}N$ growth, followed by a GaN interlayer (~2 nm thick) over the entire structure.

Figure 1B:
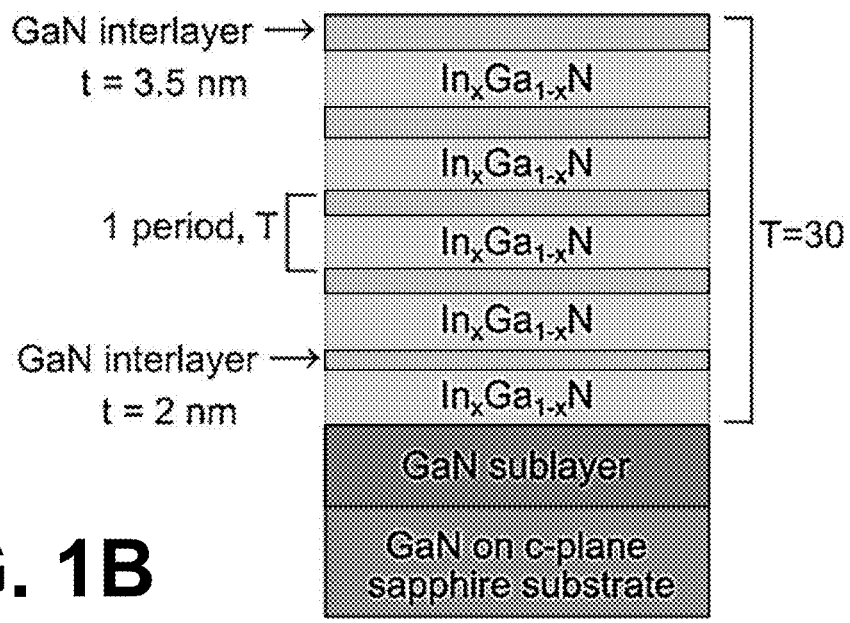

In this work, three SB samples were studied. Schematics illustrating the microstructures for the samples can be seen in FIGS. 1A and 1B. FIG. 1A shows an $In_xGa_{1-x}N$/GaN SB microstructure, where one period is equal to an $In_xGa_{1-x}N$ layer and a GaN interlayer with fixed thickness. FIG. 1B shows an $In_xGa_{1-x}N$/GaN SB microstructure, where one period is equal to an $In_xGa_{1-x}N$ layer and a GaN interlayer with varying thickness. For sample A (a conventional SB), the GaN interlayer thickness "t" was fixed at ~2 nm, as seen in FIG. 1A. For samples B-C, the GaN interlayer varied in thickness as the periods progressed; for the first 15 periods, the GaN interlayer target thickness was ~2 nm, followed by gradually increasing the GaN interlayer thickness every 3 periods until 30 periods were reached, as seen in FIG. 1B. The final thickness of the GaN interlayer for samples B-C in the last three periods was ~3.5 nm.

The indium content in the SB was controlled by the growth temperature and the number of periods, and verified via photoluminescence (PL) measurements using a 325 nm He—Cd laser. Samples A and B have the same growth temperature targeting an indium content of x~0.085, and sample C was grown at a higher temperature targeting x~0.07. Periodicity was determined by x-ray diffraction (XRD) via 2θ-ω scans of the [00.2] direction. The thickness of the periods in conventional SB is ~21 nm. Atomic Force Microscopy (AFM) images were collected on an Asylum MFP-3D classic Atomic Force Microscope with a tip with a radius of <10 nm to study the surface morphology of the samples. High-Resolution XRD (HRXRD) rocking curves (x-scans) of the symmetric (00.2) and asymmetric (10.5) reflections for sample B were collected using a Rigaku SmartLab x-Ray Diffractometer in parallel beam geometry to estimate the dislocation density.

Sample C was used for measuring the etch pit density (EPD). The technique relies on treating the samples with $SiH_4$ in the presence of $NH_3$ at high temperatures, to increase the diameter of etch pits related to screw- and edge-type TDs, making it easier to detect them using AFM. This technique can be used to study dislocation densities in GaN films. Applying such a technique directly to the InGaN template surface was not successful due to the thermal instabilities of InGaN at the high temperatures needed to delineate the etch pits. To overcome such a problem, the InGaN templates were capped with a thin fully strained 10 nm GaN layer, where silane etching was performed. The thicknesses of these GaN cap layers are lower than the critical layer thickness (CLT); thus, no additional defects are generated due to these capping layers. Thus, the EPD achieved in these capping GaN layers represents that of the underlying InGaN templates. For sample C, the 10 nm GaN cap layer was grown at 1025° C. as a protective barrier for a later silane etch. PL measurements were performed before and after the deposition of the 10 nm GaN protective layer. After AFM, silane etching was performed at 860° C., and $H_2$ and 20 ppm $SiH_4$ at 5 sccm were flowed into the reactor for a total of 15 min.

Figure 2:
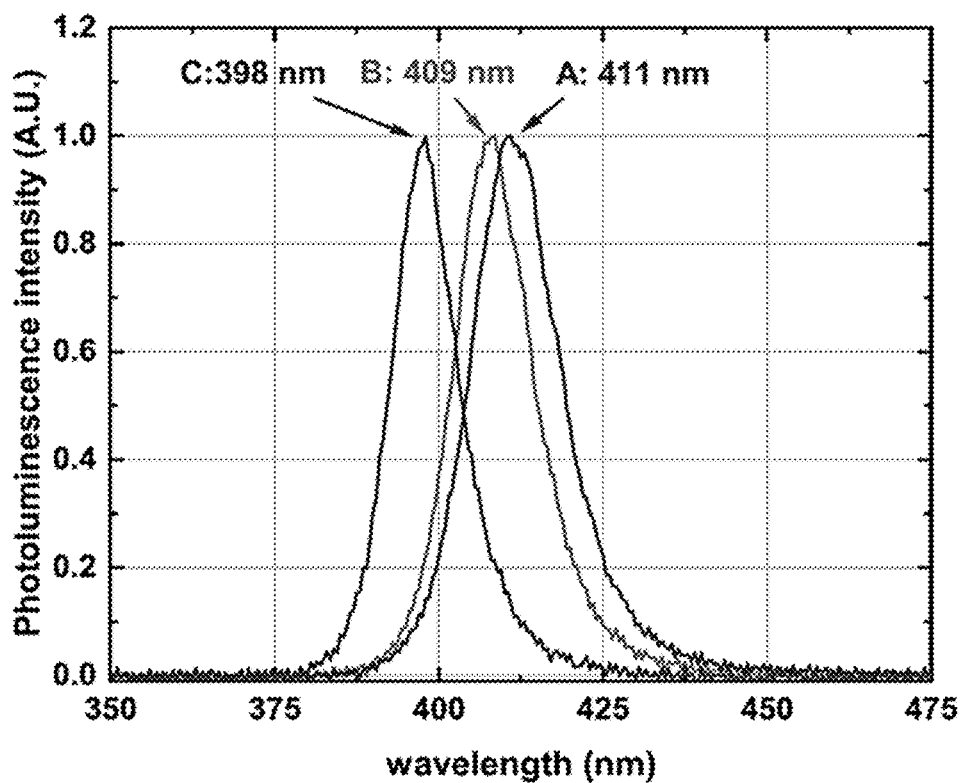
FIG. 2 illustrates examples of photoluminescence (PL) emissions for three samples (A, B and C) of $In_xGa_{1-x}N$/GaN SB microstructures, in accordance with various embodiments of the present disclosure.

Referring to FIG. 2, shown are PL emissions for each sample A, B and C. The bandgap of $In_xGa_{1-x}N$ is dependent on the indium content as well as the degree of strain relaxation of the sample. Thus, for a certain indium content, the emission can be used to estimate a range of degrees of relaxation at the topmost layers. The subject of the strain relaxation range in the SB templates is discussed elsewhere, and estimation of strain relaxation in the top layer uses a combination of PL and secondary ion mass spectrometry (SIMS). It is important to note that the degree of relaxation of the topmost layer is an estimation. Limitations of determining strain relaxation and x in the topmost layer of the semibulk templates are further discussed in the appendix of supplementary material. From previous work under similar growth conditions, SIMS data showed that for a 30-period SB emitting at 429 nm, the indium content varies from x~0.066 at the first few periods to x~0.11 at the topmost period as the sample gradually relaxes with each successive period. The degree of relaxation at the topmost layer was estimated to be ~80%. For a 20-period SB emitting at 414 nm, the indium content varied for x~0.066-0.092 with a degree of relaxation of ~60% at the topmost layer.

Applying these previous results to the PL data of the current study, sample A is emitting at 411 nm corresponding to x~0.085-0.09 with a degree of relaxation range of −60%-70%. Sample B emits at 409 nm, indicating that slightly less relaxation occurred at the top layer for this growth due to the increased interlayer thickness. The GaN interlayers are subjected to tensile stresses. For sample C emitting at 398 nm, the indium content x~0.07 with a degree of relaxation range of ~50%-60%.

Figure 3A:
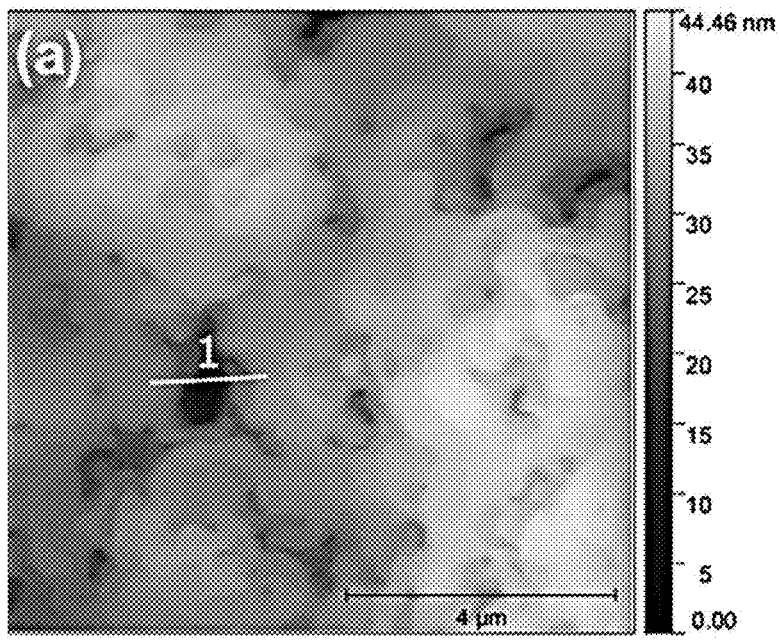
FIGS. 3A-3D illustrates examples of surface morphology of samples A and B showing the effect of increasing the GaN interlayer thickness, in accordance with various embodiments of the present disclosure.
Figure 3B:
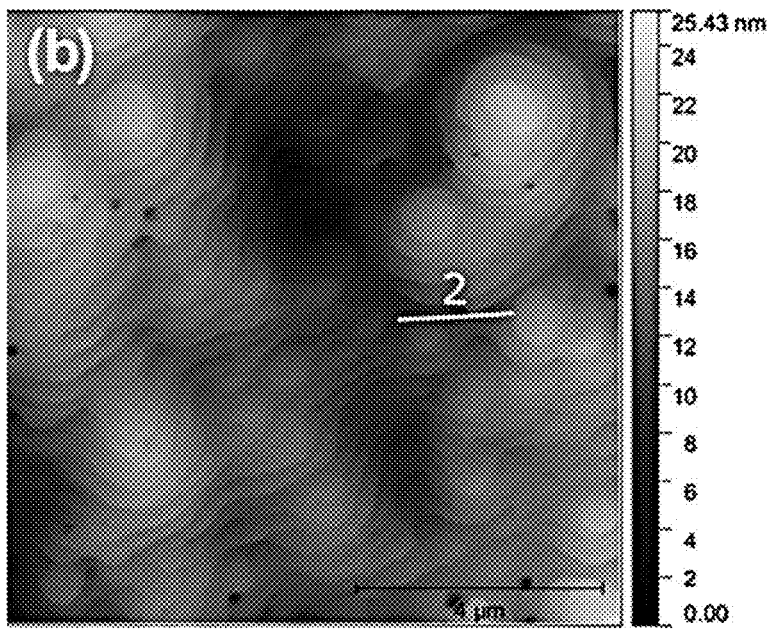
Figure 3C:
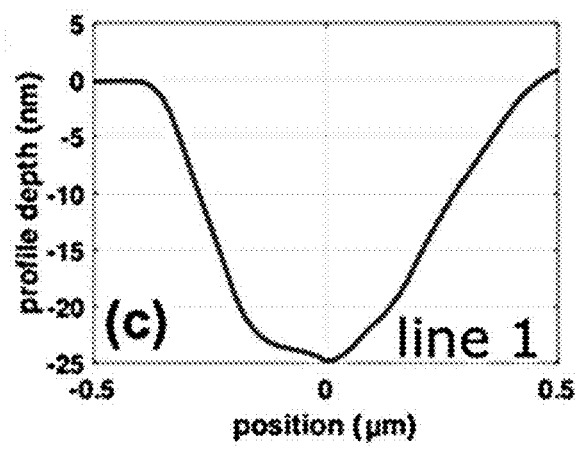
Figure 3D:
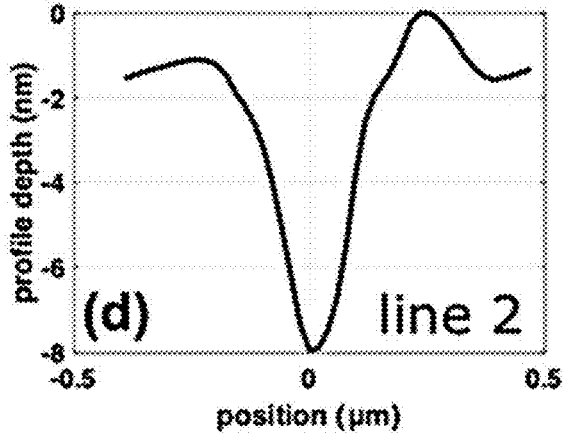

The surface morphology of sample A and sample B can be compared in the AFM height retrace seen in FIGS. 3A and 3B. As seen in FIG. 3A, sample A (conventional SB) displays large pitting and has a root mean square (RMS) surface roughness of approximately 9.20 nm. The pit density of the conventional SB is approximately $5 \times 10^7$ cm$^{-2}$; however, the pits on the surface are large in diameter as seen in FIG. 3A (and as indicated with the line profile of FIG. 3C). Sample B (SB with the increasing interlayer thickness) does not display similar pitting as seen in FIG. 3B, but instead has smaller pits at the edges of terraces, with a pit density of approximately $2 \times 10^7$ cm$^{-2}$ and an improvement in smoothness, at a RMS roughness of 3.70 nm. When surveying (1 μm)$^2$ areas of sample B, the RMS roughness is <1 nm. FIG. 3C is a line profile of a large pit (~25 nm deep) along line 1 in FIG. 3A and FIG. 3D is a line profile of a smaller, shallower pit (~8 nm deep) along line 2 in FIG. 3B. The depth profile of the pit in sample A (FIG. 3C) shows a pit depth of ~25 nm with a diameter of ~0.49 μm, whereas the depth of the pit in sample B (FIG. 3D) is ~8 nm, with a diameter of ~0.17 μm. The pit density of InGaN/GaN heterostructures prior to any surface treatment is reported to be ~$8 \times 10^7$ cm$^{-2}$. The increased GaN interlayer results in decreased V-pit on the surface.

The edge and screw dislocations can be quantified by using the (00.2) and (10.5) reflections from HRXRD x-scans (HRXRD rocking curves). GaN systems grown in the c-direction are prone to threading dislocations (TDs) with dislocations along the c-axis of the edge and screw variety due to misorientation during growth. The proportion of screw-type to edge-type dislocations varies, but, in general, more edge-type dislocations are present in hexagonal GaN systems.

Tilt (out-of-plane misorientation) is measured via (00.1) HRXRD rocking curves, and twist (in-plane misorientation) is measured via off-axis (hk. l) HRXRD rocking curves where h or k≠0. For high dislocation density films, the mosaic model can be used to describe the dislocations in the film. However, for lower dislocation density films, a random distribution model should be assumed. In the case of high dislocation density films (>$10^{10}$ cm$^{-2}$), the resulting peak profile can be described using a Gaussian model; however, for lower dislocation density films (<$5 \times 10^8$ cm$^{-2}$), the peak profile is more accurately described with a Pseudo-Voigt function. The Pseudo-Voigt function "PV" is defined as:

$$PV(x) = I_0(\eta L(x) + (1-\eta)G(x)), \quad (1)$$

which is a weighted linear convolution of a Lorentzian fit, L(x), and a Gaussian fit, G(x), multiplied by a Lorentzian fit factor, η, and x is values of x. The details of the fit that follows Eq. (1) for each rocking curve can be seen in the appendix of supplementary material. Different skew symmetric reflections are used for the quantification of the edge-type dislocations via HRXRD rocking curves; and (10.5) was chosen for this work due to the lack of distortion from the GaN sublayer rocking curve as well as a reasonable intensity. The dislocation density D can be correlated with the HRXRD rocking curves obtained via the following relationships:

$$D_{screw/edge} = \frac{\alpha_\theta^2}{2\pi \ln(2) b_{c/a}^2}, \quad (2)$$

$$D_{total} = D_{screw} + D_{edge}, \quad (3)$$

where b is the burgers vector of $b_c$=0.5185 nm and $b_a$=0.3189 nm, for screw-type and edge-type dislocations, respectively. The rotational angle, $\alpha_\theta$, is defined as:

$$\alpha_\theta = \beta(0.18446 + 0.81269(1-0.99849\eta)^{1/2} - 0.65960\eta + 0.44554\eta^2), \quad (4)$$

where β is the integral breadth of the measured $In_xGa_{1-x}N$ HRXRD rocking curve determined using a fitting software following Eq. (1). The resulting HRXRD rocking curves of sample B of (00.2) (red) and (10.5) (blue) reflections, normalized to the GaN sublayer reflection can be seen in FIG. 4.

Figures 4, 5:
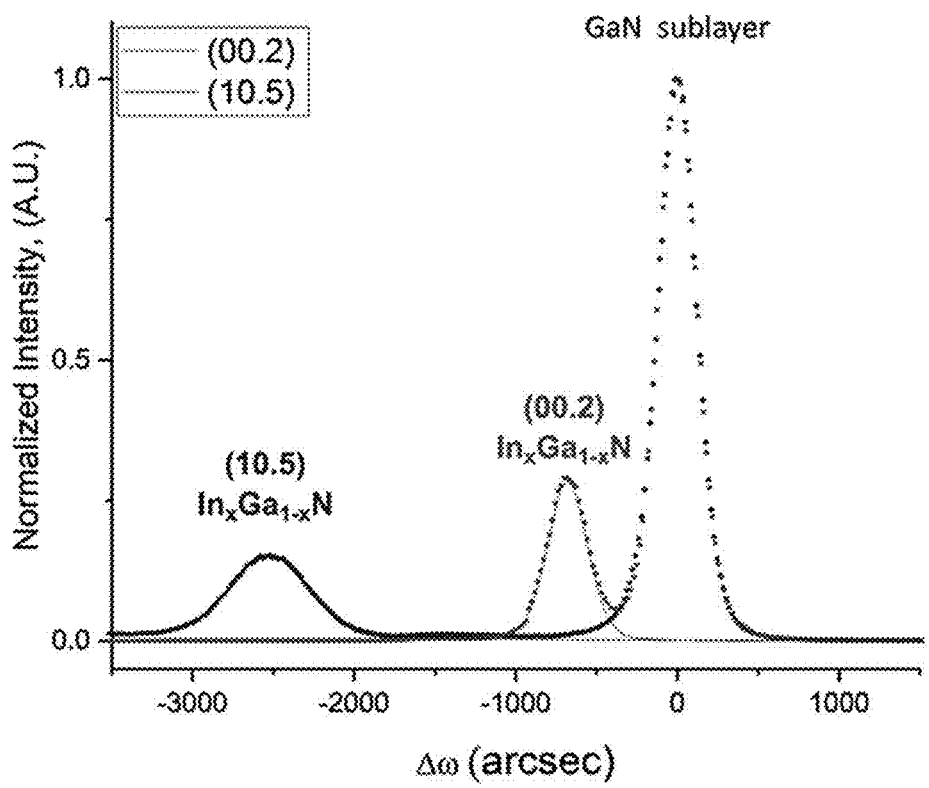
FIG. 4 illustrates examples of high-resolution x-ray diffraction (HRXRD) rocking curves of sample B, in accordance with various embodiments of the present disclosure.
FIG. 5 is a table illustrating examples of InGaN reflection and dislocation density, in accordance with various embodiments of the present disclosure.

As seen in the table of FIG. 5, the (00.2) and (10.5) reflections are observed at −680 and −2529 arc sec, respectively. The integral breadths are 332 arc sec for the (00.2) InGaN reflection and 799 arc sec for the (10.5) InGaN reflection, as seen in the table of FIG. 5. Using Eqs. (2)-(4), the dislocation density can be obtained. For the screw-type dislocation density, it is found to be approximately $1.3 \times 10^8$ cm$^{-2}$ and $5.3 \times 10^8$ cm$^{-2}$ for edge-type dislocations. The screw-type and edge-type dislocation densities of the GaN reflection are found to be $1.2 \times 10^8$ cm$^{-2}$ and $2.7 \times 10^8$ cm$^{-2}$, consistent with the manufacturer's reported dislocation density of ~$10^8$ cm$^{-2}$.

Sample C was used to determine experimentally the etch pit density (EPD) and compare it with the dislocation densities obtained from HRXRD rocking curves. FIGS. 6A-6D illustrate AFM height retrace of sample C pre-silane treatment, post growth, where step flow is seen, and small pits are observed at the termination of step-edges (indicated by arrows), and AFM height retrace of sample C, post silane treatment. An increase in the number of pits is observed, as well as an increase in the pit diameter in both scan areas. As seen in FIGS. 6A and 6C, the surface of sample C is smooth, with an RMS roughness of 1.108 nm across a (5 μm)$^2$ area, as well as being subnanometer for a (1 μm)$^2$ area and has a step flow growth mode prior to the treatment with silane. As seen in the table of FIG. 7, the pit densities are $1.3 \times 10^8$ cm$^{-2}$ for the (2 μm)$^2$ area and $7.2 \times 10^7$ cm$^{-2}$ for the (5 μm)$^2$ area, resulting in a weight average pit density of $8 \times 10^7$ cm$^{-2}$ prior to silane treatment. As seen in the (2 μm)$^2$ area height retrace, a few pits are observed. Pits observed in pre-silane treatment samples are small in size and seen at the termination of steps, consistent with how screw-type dislocations are present. As compared to FIGS. 3A and 3B, sample C exhibits a smooth surface with step-flow growth like sample B, indicating that the increasing interlayer thickness allows for a more efficient V-pit filling process.

The silane treatment results are listed in the table of FIG. 7. Qualitative observations can be used to attribute edge-type and screw-type dislocations to the etched pits. As seen in FIGS. 6B and 6D, the post treatment surface shows both an increase in the number of pits and an increase in the size of the pits. The (5 μm)$^2$ area scan was used to determine the spread of the diameter for the pits. FIG. 6E shows a histogram of the diameter of pits for sample C for the post-silane treatment (5 µm)² area scan. A bimodal distribution of pit diameters post silane anneal can be shown. Considering the grouping of the diameters, "large" pits were considered to be the diameters to the middle and far right of the histogram, corresponding to diameters greater than 98 nm, whereas "small" pits were considered pits corresponding to diameters lower than 73 nm, as seen in FIG. 6E. If the small pits are correlated with edge dislocations and large pits to screw dislocations, then the resulting weighted averages for the edge-type EPD and screw-type EPD were $1.8 \times 10^8$ cm$^{-2}$ and $5.2 \times 10^7$ cm$^{-2}$, respectively, with a total EPD of $2.3 \times 10^8$ cm$^{-2}$.

The reliability of this silane etching approach was tested by comparing the silane etch EPD results with a known standard. A 290 nm GaN layer was grown on the commercially supplied GaN on sapphire with a reported dislocation density of $\sim 10^8$ cm$^{-2}$. Similar to the results of sample C, small pits and large pits were observed on the GaN standard. The resulting small EPD attributed to edge-type TDs was $9.2 \times 10^7$ cm$^{-2}$, and large EPD attributed to screw-type dislocations was $1 \times 10^8$ cm$^{-2}$, consistent with the manufacturer's total dislocation density of $\sim 10^8$ cm$^{-2}$. There is reasonable agreement between EPD obtained due to silane etching and dislocation density obtained from HRXRD rocking curves. InGaN templates can be grown epitaxially with defect densities comparable to good quality GaN.

Using a gradually increasing GaN interlayer thickness in the SB growth procedure, it was possible to obtain device quality $In_xGa_{1-x}N$ (x~0.08) SB templates for MQW growth with low TD density and pit density. When compared to a conventional SB, the pit coalescence is minimized, and the pit density falls from $5 \times 10^7$ cm$^{-2}$ to $2 \times 10^7$ cm$^{-2}$. Screw-type and edge-type dislocations were characterized using the (00.2) and (10.5) reflections from high-resolution x-ray rocking curve omega-scans, respectively. The total dislocation density obtained via RCs was found to be $6.6 \times 10^8$ cm$^{-2}$, with the screw-type and edge-type being $1.3 \times 10^8$ cm$^{-2}$ and $5.3 \times 10^8$ cm$^{-2}$, respectively. The pit density was determined via AFM. The SB templates with the gradually increasing GaN interlayers were found to have an EPD in the range of $2.3 \times 10^8$ cm$^{-2}$. When correlating the size of the diameters (small and large) of the etch pits with screw-type and edge-type dislocations, the EPD was determined to be $5.2 \times 10^7$ cm$^{-2}$ and $1.8 \times 10^8$ cm$^{-2}$, respectively, which is consistent with the dislocation density reported for the commercially supplied GaN buffer ($1 \times 10^8$ cm$^{-2}$). The values of the EPD and the dislocation densities obtained from the HRXRD rocking curve are in reasonable agreement. However, the EPD approach of the TD density measurement allows for faster turnaround during calibration of templates for growth for devices.

See the appendix of supplementary material for detail on the estimation of strain relaxation in the semibulk samples, as well as details on the curve fitting used for the HRXRD rocking curves.

Step Grading of SB to Achieve Device Quality Templates with High in Content

Figure 8A:
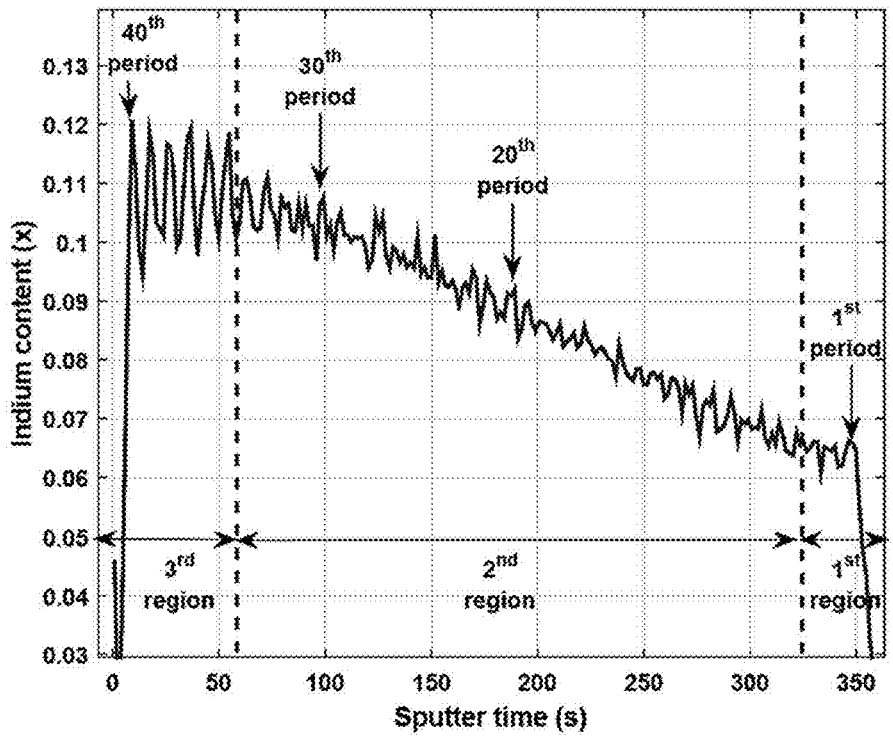
FIGS. 8A-8C illustrate examples of SIMS data for three fabricated SB templates, with several growth temperature approaches, in accordance with various embodiments of the present disclosure.
Figure 8B:
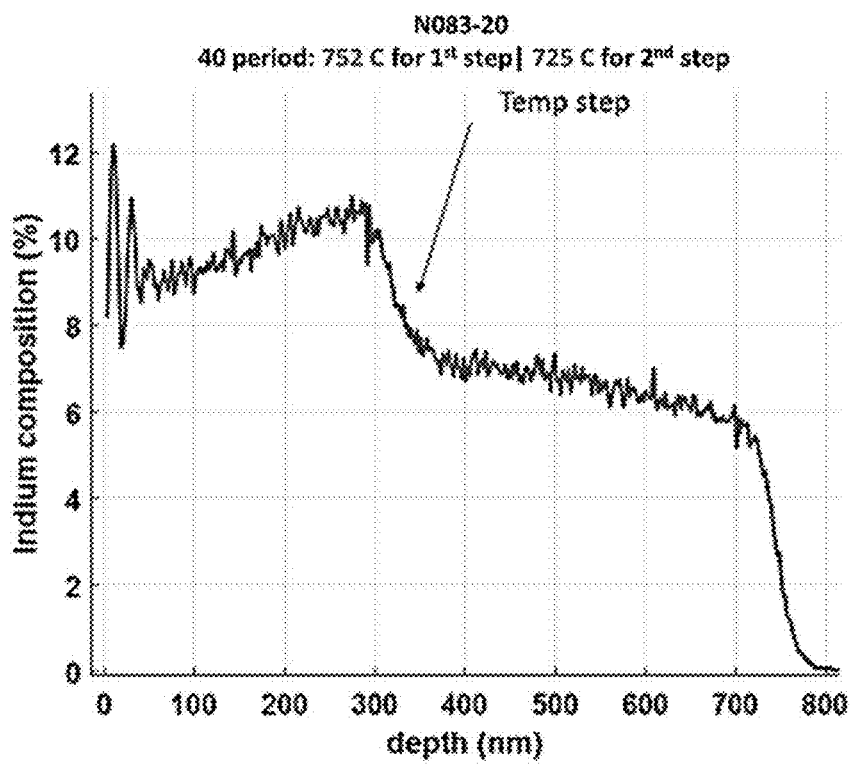

SB grown at the same growth temperature can achieve a high In content however from AFM data the surface starts to get very rough after 30 periods. FIG. 8A illustrates SIMS data for a first SB template fabricated with at a constant growth temperature. The increase in indium with the SB thickness is due to the ongoing relaxation and the reduction in strain as the SB gets thicker. SB templates can also be fabricated with two growth temperatures, both maintained for a predetermined number of periods (e.g., about 25 periods). For example, a first SB template was fabricated with 20 periods initially grown at 752° C. The temperature was then suddenly changed to 725° C. and another 20 periods grown. FIG. 8B illustrates SIMS data for the second SB template. PL data shows very broad and multiple peaks, surface is rough as indicated from AFM and SIMS.

Figure 8C:
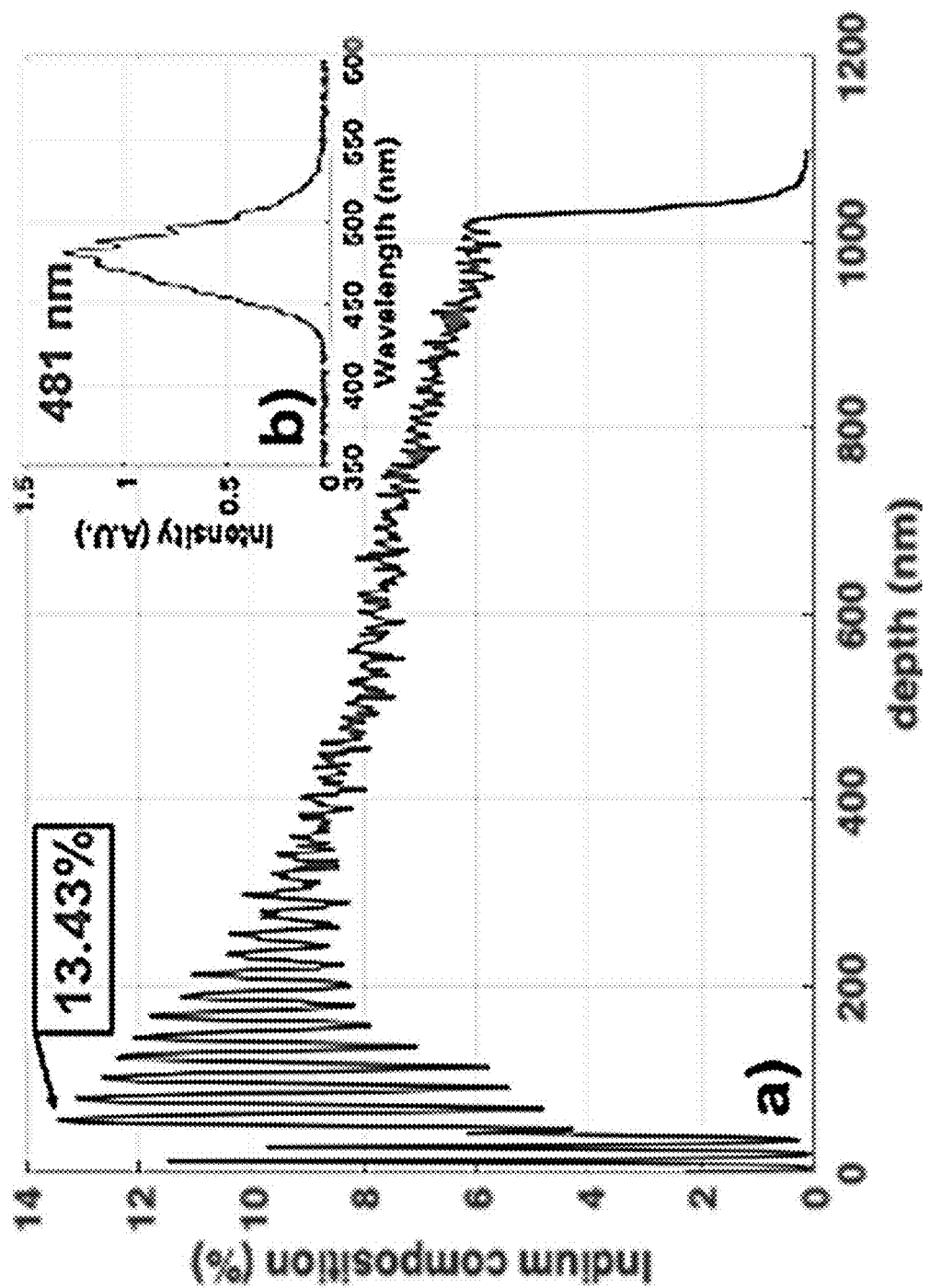

In other embodiments, the temperature can be gradually varied during the formation of at least a portion of the periods, to avoid a sudden change in Indium composition leading to a rough surfaces. For example, the first 25 periods can be grown at a constant temperature (e.g., 750° C.). The growth of the SB can then be continued while reducing the growth temperature over some or all of the remaining periods. The temperature can be adjusted in steps for one or more periods. A third SB template was fabricated with the first 25 periods grown at a constant temperature of 750° C., with the next periods grown while the growth temperature is reduced in steps at a rate of one degree per period. This step grading was carried out for 20 periods while the temperature is reduced by about 20° C. This can be followed by few periods at 730 C to achieve near constant Indium composition at the top of the template. FIG. 8C illustrates SIMS data for an InGaN template with two SB grown at two different temperatures with graded Indium compositions between the two SB. Very good signal oscillations can be seen indicating a good quality surface. From FIG. 8C, Indium approaching 14% was achieved. Roughness is better than 40 Periods shown in FIG. 8A or the sudden step shown in FIG. 8B. PL has one strong peak. To confirm the quality of the third SB template, the step grading was followed by MQW with well width of 2.5 nm, a very thin QW. PL of the QW is shown in FIG. 8C. This indicates that SBs prepared by the step grading are device quality. High values of In in the SB, while maintaining good material quality, can be instrumental in getting good red LEDs. This approach can be extended to achieve templates with Indium as high as 25% by more than one step grading.

P-Type InGaN Relaxed Template

Figure 9:
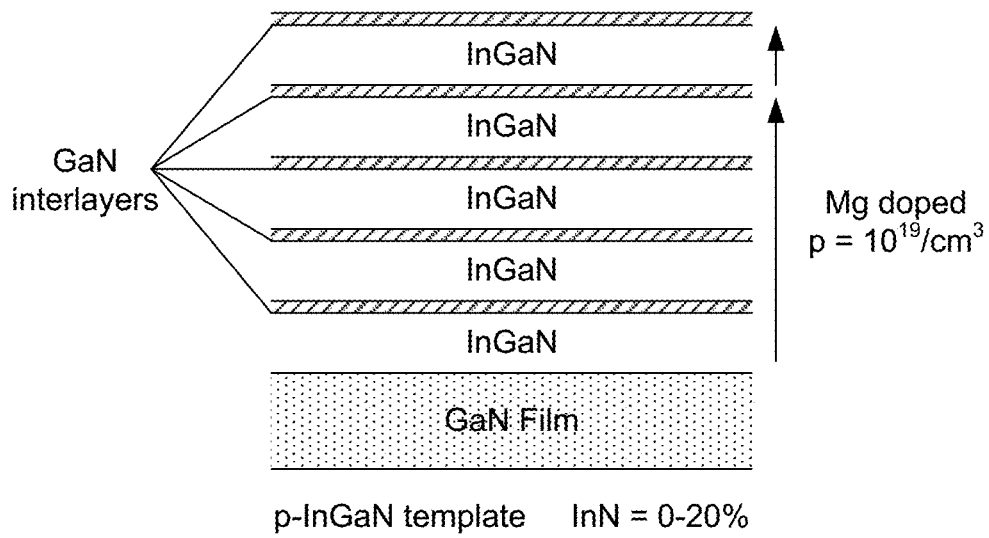
FIG. 9 illustrates an example of a p-type device quality InGaN relaxed template, in accordance with various embodiments of the present disclosure.

An example of a p-type InGaN relaxed template is illustrated in FIG. 9. Traditionally, all produced LEDs grown on n-GaN thick films rely on p-type GaN to produce the p-n junction light emitting devices. Hole concentrations in p-type GaN, grown by MOCVD, are usually lower than mid $10^{17}$/cm². Higher hole concentration is expected to improve the LEDs performances. The replacement of n-GaN by an n-InGaN template to address both Droop and the red LED problems, can be accompanied by replacing the p-GaN by p-InGaN. This can avoid the large lattice mismatch between the MQW and the p-GaN at the p-n junction, leading to defective interface resulting in poor junction. P—InGaN bulk ternary alloys may suffer from high defect density, dislocations stacking faults and others. A combination of SB and Mg doping can result in a hole concentration in the $10^{19}$/cm³ range and smooth surface free from V-pits.

High quality p-type InGaN films can be produced using the same techniques for the growth of n-InGaN device templates by replacing, e.g., silicon (n-type dopant) by Mg (p-type dopant), which can result in advantages such as:
  Lattice matched with the MQW, no defects at the junction interface.
  Achieving high hole concentrations as high $10^{19}$/cm³, more than an order of magnitude higher than in p-GaN, that can impact LED performance to achieve better hole injection.

P—InGaN can be used as templates with low pit density for the growth of inverted LEDs and solar cells for n on p structures.

LED with Very Thick Quantum Well to Avoid Droop

Figure 10:
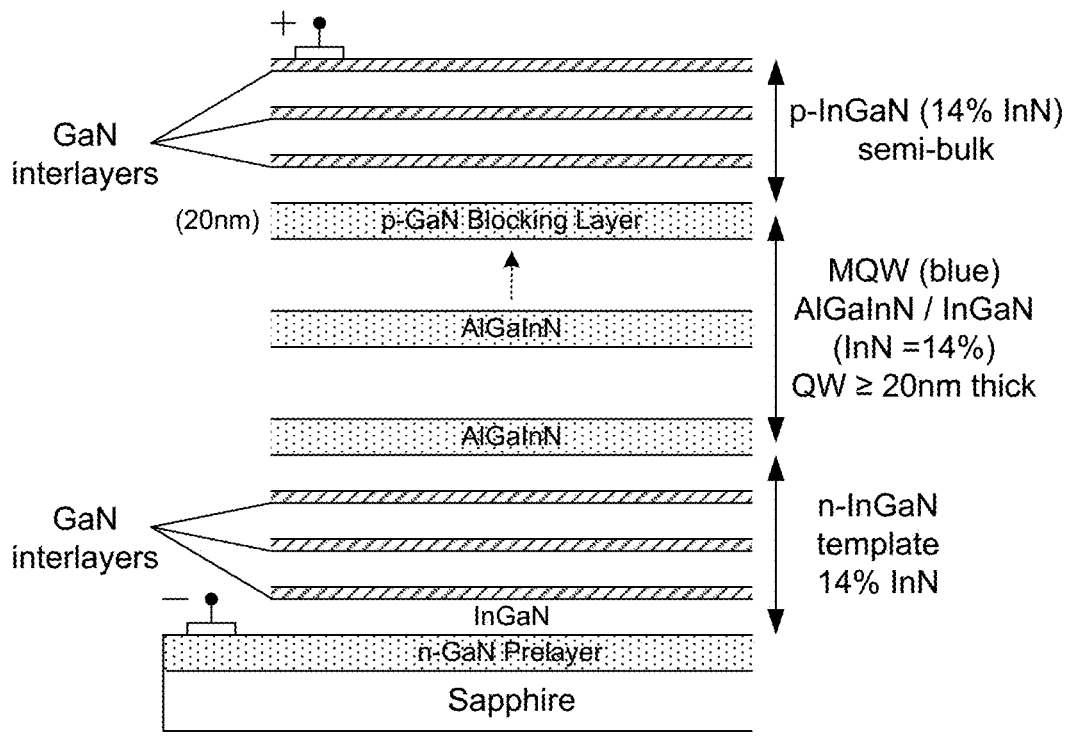
FIG. 10 illustrates an example of a QW lattice matched to n and p-type InGaN templates to eliminate Droop, in accordance with various embodiments of the present disclosure.

An example of a QW lattice matched to n and p-type InGaN templates is illustrated in FIG. 10. The strain free LED structure can eliminate droop. Droop is a result of Auger recombination that depends on $n^3$, where 'n' is the carrier density in the QW. Droop can be eliminated if the value of n in the QW is reduced. This can be achieved by having very wide quantum wells. In a traditional LED, the thickness of the InGaN QW grown on GaN is limited to a few nm due to the lattice mismatch. QWs thicker than 5 nm are usually accompanied high density of V-pits. In the structure shown in FIG. 10, because the QWs are lattice matched to the InGaN templates, there is no thickness restriction taking place. A 30 nm QW, ten times thicker than the currently used ones on GaN, will reduce n and thus the Auger recombination by three order of magnitudes, practically eliminating the droop, without effecting the internal quantum efficiency of the LEDs. The GaN barrier layers in the MQW can be replaced by a lattice matched AlInGaN to the InGaN templates.

Structure for Red LED

Figure 11:
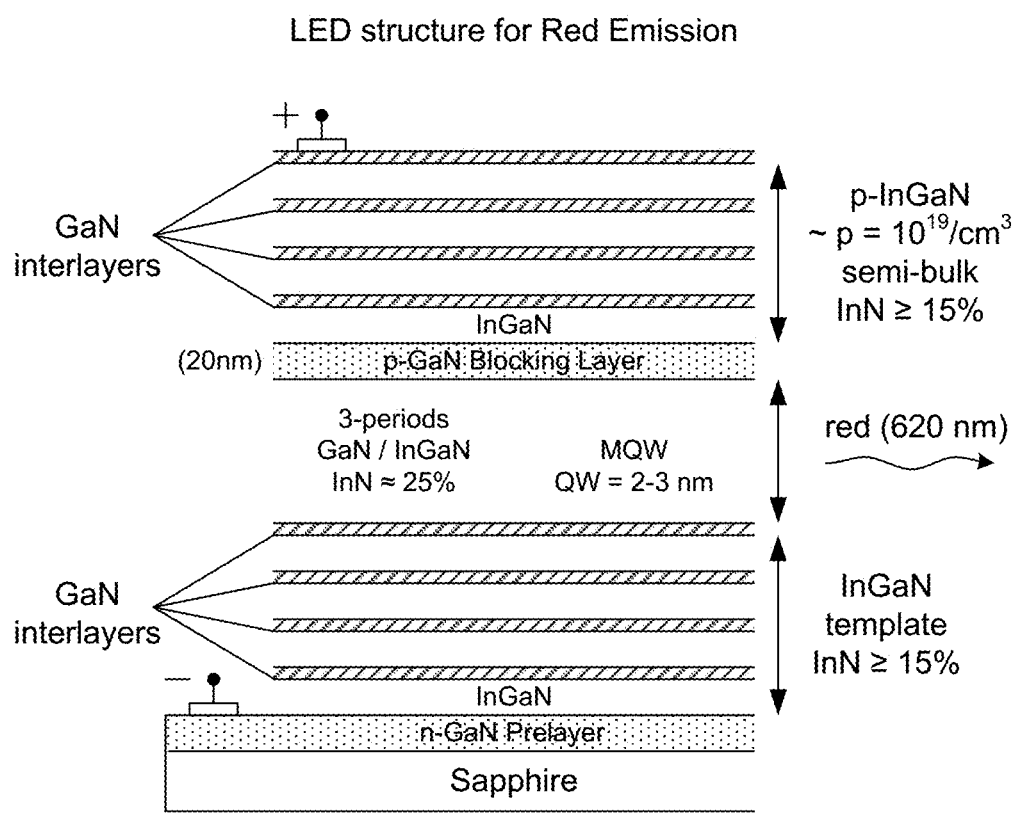
FIG. 11 illustrates an example of an LED for red emission, in accordance with various embodiments of the present disclosure.

An example of an LED for red emission is illustrated in FIG. 11. Currently InGaN QWs, with about 40% InN in red LED are strained to the n-GaN films. The strain can produce a very harmful effect. InGaN templates with InN higher than 15% based upon the disclosed model can address current problems facing red LEDS such as, e.g.:

Reducing the strain and blue shift in emission in the QWs.

Due the compositional pulling effect, resulting from the reduced strain, the In % in the QW will increase by a factor of 2 (e.g., from 20% to 40%).

Allowing the growth of the QW in red LEDs to take place at higher growth temperature, allowing better material quality.

For a Blue LED grown on GaN, the emission can be shifted to Red LED for the same MQW if the GaN is replaced by InGaN template with InN about 15%.

The disclosure has presented a synthesis of InGaN templates that are closely lattice matched to the InGaN quantum wells (QW), the light emitting component in LEDs. The approach reduces and/or eliminates the harmful strain in the QWs as compared to the current approach adopted by industries by their growth on highly lattice mis-matched GaN substrates. The approach is based on a modified SB growth of InGaN that minimizes defect generations during the synthesis of these templates. This approach will allow the solution "droop" and "green-gap" problems and achieve red LEDs with high efficiency for display applications.

A problem in LEDs is that the $In_xGa_{1-x}N$ quantum wells (QW), the light emitting component, are grown highly strained to GaN substrates due to high lattice mismatch of 11% between InN and GaN. This compressive strain in the QW results in several harmful effects such as an increase in the InGaN band gap (wrong directions), limiting the QW thickness, reducing both Indium (In) incorporation and the Internal Quantum Efficiency (IQE) and generating structure defects such as pits that impact device performances. While blue LEDs with low % of Indium (In) in the QW, provide high quantum efficiency, however, the efficiency drops dramatically for x higher than 20% to achieve emission beyond 520 nm (the green Gap) needed for the yellow and red colors. The strain reduction may also result in enhancements in Indium incorporation in the QWs, due the composition pulling effect that can as high as 50%. This can avoid the requirement to grow the QW at low temperatures with the accompanied poor material qualities. The availability of $In_yGa_{1-y}N$ templates with lattice constant closer to that of the QW will eliminate/reduce the strain in the QW. During the last decades efforts to synthesis InGaN relaxed templates were not successful due to the high density of V-pits, dislocations and stacking faults. Recently there are intense efforts by several groups to re-address this issue.

A Semi-Bulk (SB) approach has been developed for the growth of InGaN templates on GaN substrates. The SB can contain, e.g., 20 to 30 periods about 20 nm thick $In_yGa_{1-y}N$ with 1-2 thick GaN interlayers. The modified approach can achieve device quality relaxed InGaN templates with Indium contents higher than 10. These high density ($>5\times10^8/cm^2$) deep V-pits, 10-15 nm deep can impact the device performances based on QW. The manipulation of the thickness and the frequency of the GaN interlayers can refill the V-pits as they form during the SB growth, before they get bigger and cannot be handled. By gradually increasing the thickness of the GaN interlayers from 1-2 nm to 4-5 nm especially during the last several periods, device quality of highly relaxed InGaN templates are achieved. The pit density in the low $10^7/cm^2$ range, surface roughness of 1-2 nm and dislocation density (DD) in the low $10^8/cm^2$ are achieved and are comparable to the device quality GaN currently used by all LED manufacturers. Also, device quality InGaN templates with Indium higher than 10% are achieved while maintaining the low density of V-pits and DD. Also, the LED emission may be shifted from blue to yellow by replacing the GaN substrate by InGaN template due the reduced strain and the compositional pulling effect. This approach can be extended to achieve higher values of Indium approaching 15% by a two step SB grown at different temperatures. Decreasing the growth temperature from the first SB to the second SB was done a transitional procedure between the two steps to avoid any generation of higher V-pit density.

The EQE of red LEDs, in the GaN material system, are more than one tenth (e.g., ¹⁄₂₀ or ¹⁄₃₀) of the blue ones. For display devices, the goal of having the three primary colors (Blue, green and red) from one material system (InGaN) will be questioned till LED emitting in red can be achieved. The disclosed InGaN templates can improve emission in red by reducing the strain and allowing high temperature growth of the QW taking advantages of the compositional pulling effect. It can be estimated that with a combination of $In_yGa_{1-y}N$ templates with y=15% and $In_xGa_{1-x}N$ QW with x about 25%, grown at high temperatures, red LED with high EQE can be realized.

TEM and AFM studies have shown that relaxation in the initial (or lowest) periods (e.g., the first 10-15 periods) do not generate V-pits or the V-pits are very small so they can be filled by the GaN interlayers. As the number of stacked periods of a InGaN template is increased, to achieve higher In % and a higher degree of relaxation, the V-pits that are formed can increase in size. As the V-pit size increases (e.g., several nm in size), the thicker GaN interlayers may not be as effective in filling the V-pits. As the surface starts to get rougher (e.g., including V-pits with sizes about 7-10 nm or larger), a strain layer superlattice (SLS) structure comprising GaN/InGaN with a few % of In (e.g., 10-14% or less). For example, the SLS structure can be effective if formed after a defined number of the stacked periods (e.g., after about ²⁄₃ of the total periods) are deposited. Inclusion of the SLS structure can improve performance of the devices or LED.

Figure 12:
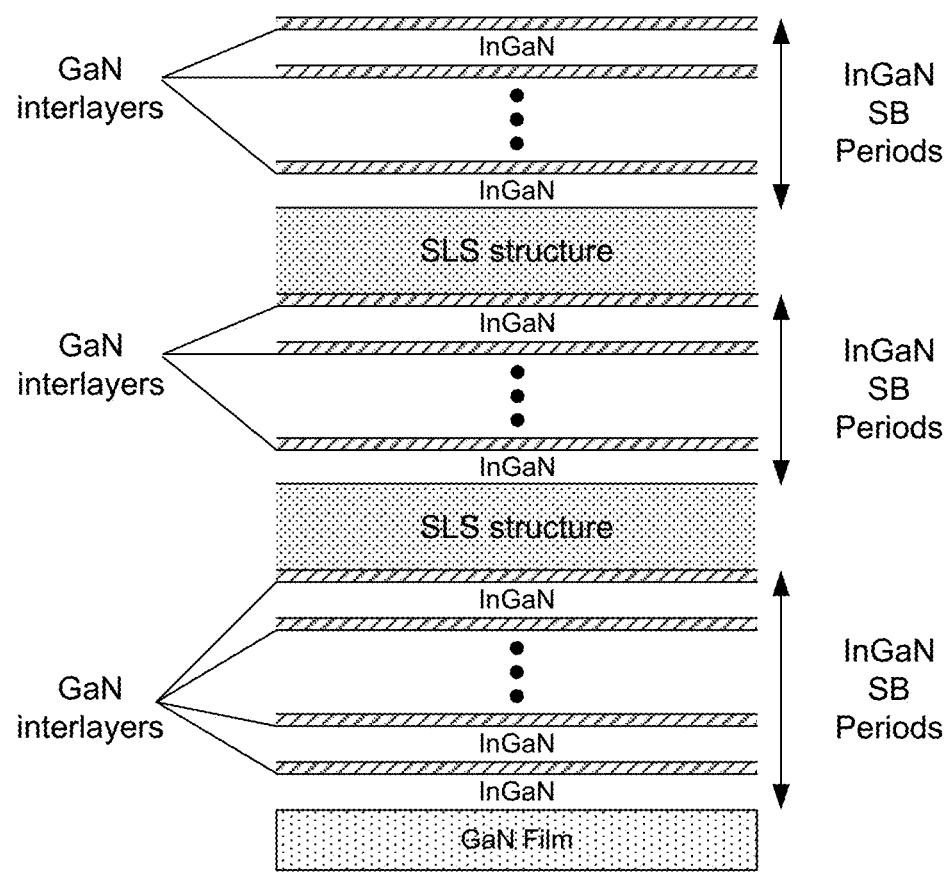
FIG. 12 illustrates an example of strain layer superlattice (SLS) structures between SB microstructures, in accordance with various embodiments of the present disclosure.

FIG. 12 illustrates an example of SLS structures between SB microstructures. A first plurality of stacked periods (e.g., 10-15 periods) disposed on the GaN film can be separated from a second plurality of stacked periods by the SLS structure. As shown in the example of FIG. 12, another SLS structure can separate the second plurality of stacked periods (e.g., 10 periods) from a third plurality of stacked periods, and/or can disposed on top the SB structure. By including the SLS structures, the pit density can be significantly reduced by acting to "reset" the growth surface to a smoother state, before continuing with the additional SB periods. The SLS structure can comprise, e.g., 3-5 periods of GaN/InGaN about 3-4 nm thick with an In concentration less than SB periods.

A multibillion market is waiting for an efficient red LEDs. Micro LEDs can potentially replace organic LED, liquid crystal display due to their higher resolution, efficiency and contrast ratio, making them ideal for a broad application from-near-eye head-mounted displays to large area limited displays. It is also predicted that microLED are desirable for next generation displays such as 8K TVs, smart watches, smart phones and augmented and virtual reality (AR/VR). MicroLED LEDs can fabricated from our SB templates by etching.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about y".

Therefore, at least the following is claimed:

1. A device structure, comprising:
a GaN layer; and
a semibulk (SB) template comprising a plurality of stacked periods on the GaN layer, each period comprising a layer of InGaN and a GaN interlayer disposed on the layer of InGaN, where a thickness of the GaN interlayer of a top period of the plurality of stacked periods is greater than a thickness of the GaN interlayer of a bottom period of the plurality of stacked periods, the bottom period disposed on the GaN layer, wherein the layer of InGaN comprises p-InGaN or n-InGaN.

2. The device structure of claim 1, wherein the plurality of stacked periods comprises a first group of stacked periods including the bottom period, wherein each of the first group of stacked periods has a GaN interlayer thickness substantially equal to the thickness of the GaN interlayer of the bottom layer.

3. The device structure of claim 2, wherein the plurality of stacked periods comprises a second group of stacked periods disposed on first group of stacked periods, wherein each of the second group of stacked periods has a GaN interlayer thickness that is greater than the thickness of the first group of stacked periods.

4. The device structure of claim 3, wherein the thickness of the GaN interlayer of each of the second group of stacked periods is substantially equal.

5. The device structure of claim 3, wherein the thickness of the GaN interlayer of each of the second group of stacked periods increases from a bottom period of the second group of stacked periods to a top period of the second group of stacked periods.

6. The device structure of claim 3, wherein the second group of stacked periods comprises the top period of the plurality of stacked periods.

7. The device structure of claim 1, wherein the GaN layer is a GaN blocking layer.

8. The device structure of claim 7, wherein the GaN blocking layer is disposed on a multiple quantum well (MQW) layer.

9. A device structure, comprising:
a GaN layer; and
a semibulk (SB) template comprising a plurality of stacked periods on the GaN layer, each period comprising a layer of InGaN and a GaN interlayer disposed on the layer of InGaN, where a thickness of the GaN interlayer of a top period of the plurality of stacked periods is greater than a thickness of the GaN interlayer of a bottom period of the plurality of stacked periods, the bottom period disposed on the GaN layer, where the layer of InGaN comprises $In_xGa_{1-x}N$, wherein InN of the layer of InGaN is about 15% or greater.

10. The device structure of claim 9, wherein the InN is in a range from about 15% to about 25%.

11. A device structure, comprising;
a GaN layer; and
a semibulk (SB) template comprising a plurality of stacked periods on the GaN layer, each period comprising a layer of InGaN and a GaN interlayer disposed on the layer of InGaN, where a thickness of the GaN interlayer of a top period of the plurality of stacked periods is greater than a thickness of the GaN interlayer of a bottom period of the plurality of stacked periods, the bottom period disposed on the GaN layer, wherein the GaN layer is a GaN blocking layer comprising p-GaN and the layer of InGaN comprises p-InGaN or the GaN blocking layer comprises n-GaN and the layer of InGaN comprises n-InGaN.

12. The device structure of claim 11, wherein the GaN layer is a GaN prelayer disposed on a sapphire substrate.

13. A device structure, comprising:
a GaN layer:
a semibulk (SB) template comprising a plurality of stacked periods on the GaN layer, each period comprising a layer of InGaN and a GaN interlayer disposed on the layer of InGaN, where a thickness of the GaN interlayer of a top period of the plurality of stacked periods is greater than a thickness of the GaN interlayer of a bottom period of the plurality of stacked periods, the bottom period disposed on the GaN layer; and a strain layer superlattice (SLS) structure disposed between a first plurality of stacked periods of the SB template on the GaN layer and a second plurality of stacked periods of the SB template disposed on the SLS structure.

14. The device structure of claim 13, wherein the layer of InGaN comprises $In_xGa_{1-x}N$.

15. The device structure of claim 14, wherein x is in a range from about 0.02 to about 0.25.

16. The device structure of claim 13, wherein a light emitting diode (LED) comprises the device structure.

17. The device structure of claim 13, wherein the plurality of stacked periods comprises a first group of stacked periods including the bottom period, wherein each of the first group of stacked periods has a GaN interlayer thickness substantially equal to the thickness of the GaN interlayer of the bottom layer.

18. A method, comprising:

forming a GaN layer; and forming a semibulk (SB) template comprising a plurality of stacked periods on the GaN layer, each period comprising a layer of InGaN and a GaN interlayer disposed on the layer of InGaN, where a bottom period of the plurality of stacked periods is formed at a first temperature and a second period of the plurality of stacked periods is formed at a second temperature less than the first temperature, where a thickness of the GaN interlayer of a top period of the plurality of stacked periods is greater than a thickness of the GaN interlayer of a bottom period of the plurality of stacked periods, the bottom period disposed on the GaN layer.

19. The method of claim 18, wherein the plurality of stacked periods comprises a first group of stacked periods including the bottom period, wherein each period of the first group of stacked periods is formed at the first temperature.

20. The method of claim 19, wherein the plurality of stacked periods comprises a second group of stacked periods formed on the first group of stacked periods, wherein each period of the second group of stacked periods is formed at the second temperature that is less than the first temperature.

21. The method of claim 19, wherein the plurality of stacked periods comprises a second group of stacked periods formed on the first group of stacked periods, wherein a first period of the second group of stacked periods is formed at a temperature less than the first temperature and each subsequent period of the second group of stacked periods is formed at a temperature that is less than the temperature at which the preceding period was formed.

22. The method of claim 18, wherein individual periods of the plurality of stacked periods are formed at temperatures that are reduced in a gradual or step-wise fashion.

* * * * *